(12) United States Patent
Uemura

(10) Patent No.: US 7,038,246 B2
(45) Date of Patent: May 2, 2006

(54) LIGHT EMITTING APPARATUS

(75) Inventor: Toshiya Uemura, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/625,895

(22) Filed: Jul. 24, 2003

(65) Prior Publication Data

US 2004/0129945 A1 Jul. 8, 2004

(30) Foreign Application Priority Data

Jul. 25, 2002 (JP) .............................. 2002-217334
Jun. 3, 2003 (JP) .............................. 2003-158401

(51) Int. Cl.
*H01L 33/00* (2006.01)
*H01L 27/15* (2006.01)

(52) U.S. Cl. ............................ 257/98; 257/79; 257/89; 257/100

(58) Field of Classification Search ............ 257/79–82, 257/89, 98, 100; 313/494; 359/295
See application file for complete search history.

(56) References Cited

U.S. PATENT DOCUMENTS 5,698,941 A * 12/1997 Jaskie et al. ................. 313/494

6,195,196 B1 * 2/2001 Kimura et al. ............... 359/295
6,310,364 B1   10/2001 Uemura

FOREIGN PATENT DOCUMENTS

JP   2001-217466   8/2001

OTHER PUBLICATIONS

U.S. Appl. No. 10/393,024, filed Mar. 21, 2003, Specification and drawings.

* cited by examiner

*Primary Examiner*—Ori Nadav
(74) *Attorney, Agent, or Firm*—McGinn IP Law Group, PLLC

(57) ABSTRACT

A light emitting apparatus has: a light emitting element of nitride semiconductor; a phosphor that absorbs light emitted from the light emitting element and emits light with a wavelength different from that of the absorbed light; a first reflection mirror that reflects the light emitted from the light emitting element to converge the light; a second reflection mirror that has a light passing hole at a position on which the light reflected on the first reflection mirror is converged and that has a reflection surface on the side opposite to the side facing the first reflection mirror; and a phosphor layer that includes the phosphor, the phosphor layer being placed over the light passing hole and at a specific region in transparent resin that part of light passing through the light passing hole is radiated.

16 Claims, 9 Drawing Sheets

LIGHT EMITTING APPARATUS

The present application is based on Japanese patent application Nos. 2002-217334 and 2003-158401, the entire contents of which are incorporated herein by reference.

BACKGROUND OF THE INVENTION

1. Field of the Invention

This invention relates a light emitting apparatus that includes a light emitting element and a phosphor, and particularly to a light emitting apparatus that can be applied to an LED display, a backlight device, a traffic light, a lighting switch, sensors, indicators etc.

2. Description of the Related Art

Light emitting elements used for a light emitting apparatus include inorganic LED (light emitting diode), organic LED, laser diode, inorganic thick film electroluminescence sheet, inorganic thin film electroluminescence sheet et. LED is especially advantageous in that it is long-life, compact, shock-resistant, suitable for emission of narrow spectrum band.

However, by means of the proper emission of LED, multiple light colors or multiple light colors of especially wide spectrum band cannot be realized or can be only inefficiently. This is particularly applied to the case that white light is intended to obtain.

In state of the art, a light color that is originally impossible to obtain by semiconductor LED can be obtained by wavelength conversion technique. The principles of wave length conversion technique are as follows. At least one phosphor is placed over or around LED, the phosphor absorbs the light emitted from the LED and emits light with a wavelength different from that of the absorbed light. In other words, after absorbing the light emitted from the LED, it emits photoluminescent light with another emission color.

Japanese patent application laid-open No. 2001-217466 discloses a light emitting apparatus that a light emitting element (or LED) is placed on the center axis of a reflection mirror, covered with phosphor-dispersed epoxy resin, and, in operation, the light emitted from the LED is absorbed or dispersed, so that the light with a wavelength different from that of the absorbed light, i.e., another color light is radiated in all directions.

For example, a white LED lamp known is composed such that light emitted from a blue LED is wavelength-converted by a YAG (yttrium aluminum garnet)-group phosphor. In this white LED lamp, the blue light emitted from the blue LED is wavelength-converted into yellow light and then the yellow light is mixed with the blue light to be felt white by human eyes. The phosphor is mixed into the epoxy resin or silicone resin for sealing the blue LED such that the phosphor is positioned around the blue LED.

However, in the conventional light emitting apparatus, there is a problem that the excitation light emitted from the phosphor or the light emitted from the LED is dispersed so that the light cannot be sufficiently outputted in the direction of emission observation surface.

Especially the light returning to the LED is not sufficiently reflected in the direction of emission observation surface and, therefore, the emission efficiency must be lowered.

Although the light emitting apparatus disclosed in Japanese patent application laid-open No. 2001-217466 has a reflection mirror, plenty of dispersion will be caused by the phosphor provided around the LED. Because of this, the emission efficiency must be lowered since the light is not sufficiently outputted in the direction of emission observation surface.

SUMMARY OF THE INVENTION

It is an object of the invention to provide a light emitting apparatus that the dispersion due to the phosphor can be suppressed to improve the emission efficiency.

According to the first aspect of the invention, a light emitting apparatus, comprises:

a light emitting element of nitride semiconductor;

a phosphor that absorbs light emitted from the light emitting element and emits light with a wavelength different from that of the absorbed light;

a first reflection mirror that reflects the light emitted from the light emitting element to converge the light;

a second reflection mirror that has a light passing hole at a position on which the light reflected on the first reflection mirror is converged and that has a reflection surface on the side opposite to the side facing the first reflection mirror; and a phosphor layer that includes the phosphor, the phosphor layer being placed over the light passing hole and at a specific region in transparent resin that part of light passing through the light passing hole is radiated.

According to the second aspect of the invention, a light emitting apparatus, comprises:

a light emitting element of nitride semiconductor;

a phosphor that absorbs light emitted from the light emitting element and emits light with a wavelength different from that of the absorbed light, a first reflection mirror that reflects the light emitted from the light emitting element;

a lens for converging the light reflected on the first reflection mirror;

a second reflection mirror that has a light passing hole at a position on which the light is converged by the lens and that has a reflection surface on the side opposite to the side facing the lens; and a phosphor layer that includes the phosphor, the phosphor layer being placed over the light passing hole and at a specific region in transparent resin that part of light passing through the light passing hole is radiated.

According to the third aspect of the invention, a light emitting apparatus, comprises:

a light emitting element of nitride semiconductor;

a phosphor that absorbs light emitted from the light emitting element and emits light with a wavelength different from that of the absorbed light;

a plurality of first reflection mirrors that reflect the light emitted from the light emitting element to converge the light on positions different from one another;

a second reflection mirror that has a plurality of light passing holes at the light converging positions and that has a reflection surface on the side opposite to the side facing the first reflection mirror; and a plurality of phosphor layers that include the phosphor, the phosphor layers being placed over the light passing holes and at specific regions in transparent resin that part of light passing through the light passing holes is radiated.

According to the fourth aspect of the invention, a light emitting apparatus, comprises:

a light emitting element of nitride semiconductor;

a phosphor that absorbs light emitted from the light emitting element and emits light with a wavelength different from that of the absorbed light;

a plurality of reflection mirrors that reflect the light emitted from the light emitting element to converge the light;

a plate member on which the light emitting element is mounted and which has a plurality of light passing holes provided corresponding to positions where the light reflected on the plurality of reflection mirrors is converged;

a pair of lead electrodes that are placed on the plate member while being divided into two, the lead electrodes being connected with boding wires for supplying power to the light emitting element; and a plurality of phosphor layers that include the phosphor, the phosphor layers being placed over the light passing holes and at specific regions in transparent resin that part of light passing through the light passing holes is radiated.

According to the fifth aspect of the invention, a light emitting apparatus, comprises:

a light emitting element of nitride semiconductor;

a phosphor that absorbs light emitted from the light emitting element and emits light with a wavelength different from that of the absorbed light;

a converging member that converges the light emitted from the light emitting element on a convergence region in the direction of emission observation surface;

transparent resin that is molded such that the phosphor is located at the convergence region; and a reflection mirror chat reflects the light reflected on the phosphor again in the direction of emission observation surface.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

[First Embodiment]

Figure 1:
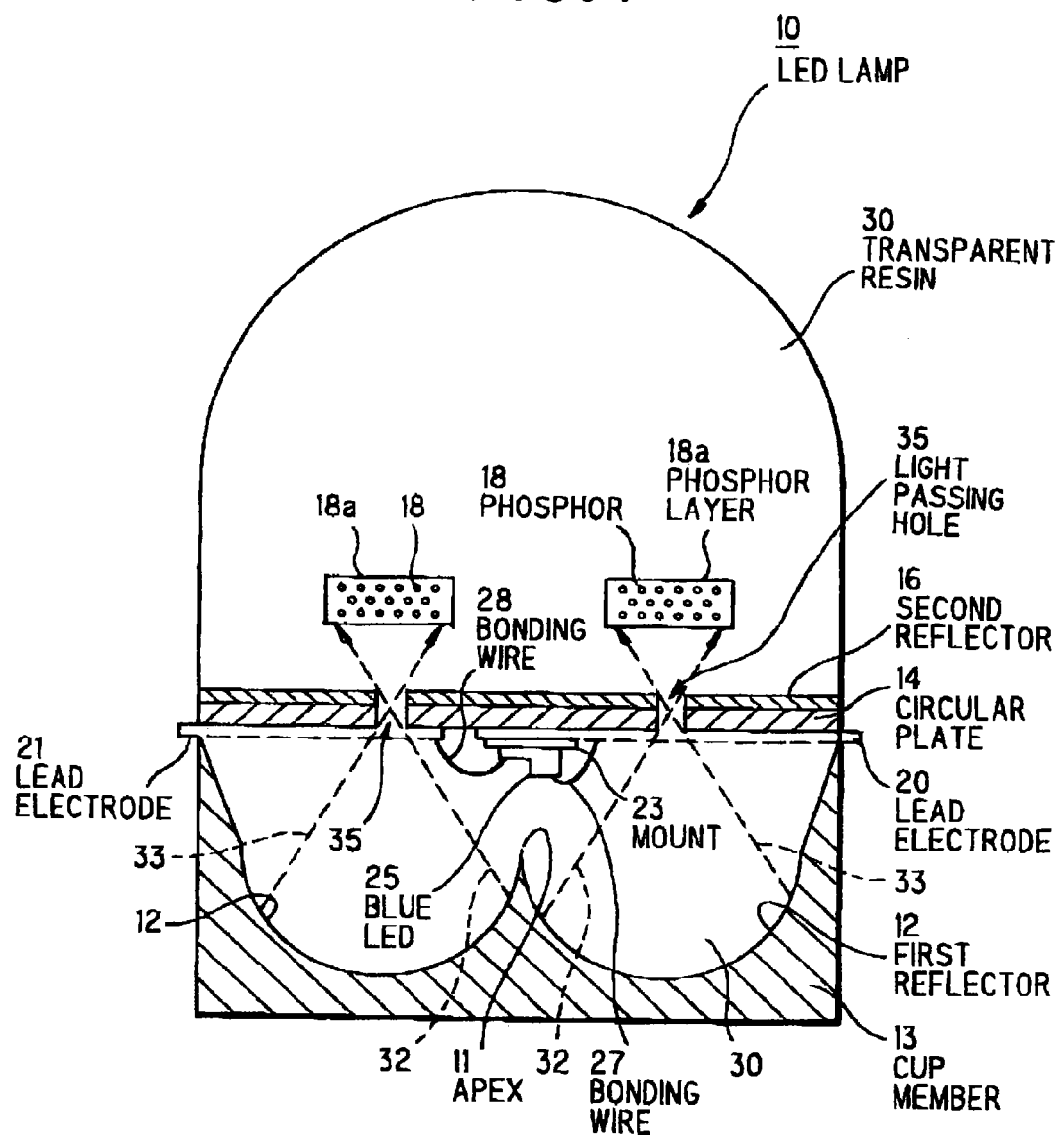
FIG. 1 is a cross sectional view showing the structure of a light emitting apparatus in a first preferred embodiment according to the invention.
Figure 2:
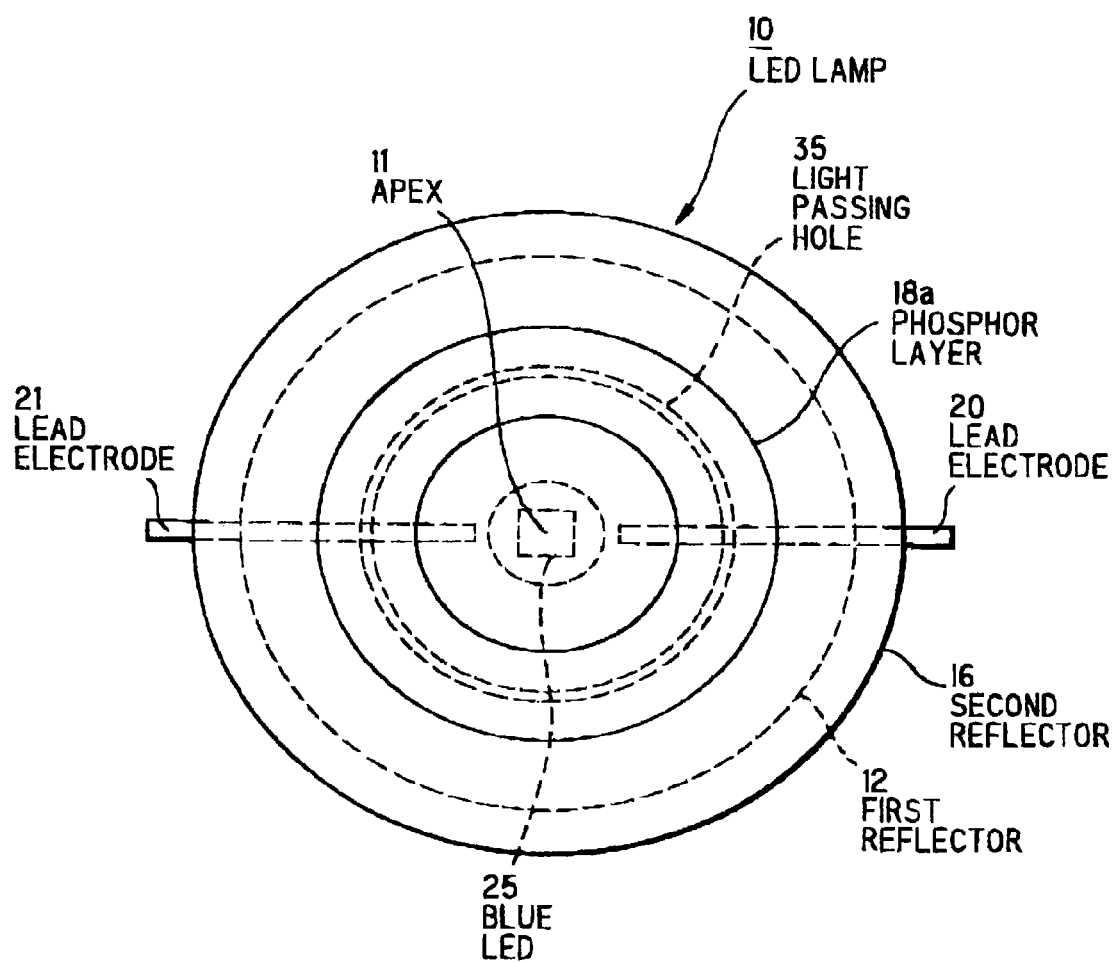
FIG. 2 is an enlarged perspective top view showing the light emitting apparatus in FIG. 1.

FIG. 1 is a cross sectional view showing the structure of a light emitting apparatus in the first preferred embodiment according to the invention. FIG. 2 is an enlarged perspective top view showing the light emitting apparatus in FIG. 1.

In this embodiment, the light emitting apparatus is structured as an LED lamp.

As shown in FIG. 1, the LED lamp 10 is of so-called lens-type that light emitted from a light emitting element is wavelength-converted by phosphor and then radiated outside the lens-type resin sealing mold. The LED lamp 10 includes: a first reflector 12 (first reflection mirror); a second reflector 16 (second reflection mirror) that is provided on a circular plate 14, a ring-shaped phosphor layer 18a that is provided above the second reflector 16, phosphor 18 being mixed into the phosphor layer 18a; a pair of lead electrodes 20, 21 that are provided under the circular plate 14; a blue LED 25 (light emitting element) that is fixed through a mount 23 to the surface of one lead electrode 20; boding wires 27, 28 that are used to connect the blue LED 25 and the lead electrodes 20, 21; and lens-type transparent resin 30 that seals substantially the entire lamp.

The first reflector 12 has a reflective surface that is formed to have a ring-shaped concave portion the cross section of which is formed semicircle. At the center of the ring-shaped concave portion, there is formed an apex 11 that projects upward. Over the apex 11 (the center of the first reflector 12), the blue LED 25 is positioned. Light emitted from the blue LED 25 is reflected on the reflective surface such that, as shown by dotted lines with arrows in FIG. 1, it converges on predetermined positions of the circular plate 14.

The first reflector 12 is made by depositing film of aluminum etc. on the surface of a cup member 13 that is formed to have a ring-shaped concave portion the cross section of which is formed semicircle. The second reflector 16 is also made by depositing film of aluminum etc. on the circular plate 14. Alternatively, it may be made by attaching an aluminum plate to the circular plate 14. The reflection film to compose the first reflector 12 or second reflector 16 is preferably such a film that reflects light with a wavelength of 350 to 780 nm.

The circular plate 14 and the second reflector 16 have a ring-shaped light passing hole 35 at the position where reflected light converges on. The reflected light passes through the light passing hole 35 as shown by the dotted lines with arrows in FIG. 1. The passed light is then radiated to the phosphor layer 18a. Part of the reflected light passes through the phosphor layer 18a and transparent resin 30 without being wavelength-converted while being not radiated to the phosphor layer 18a or being reflected on the phosphor 18 in the phosphor layer 18a. The light passing hole 35 is filled with the transparent resin 30. The phosphor layer 18a is placed over the light passing hole 35 where reflected light converges on and is placed at a position where a predetermined amount of blue light is radiated to.

The phosphor layer 18a is made by forming a ring-shaped groove with a predetermined width at a predetermined position in a circular plane of bombshell-shaped epoxy resin or silicone resin corresponding to the upper half of the LED lamp 10, then pouring resin with the phosphor 18 mixed into the ring-shaped groove. After making the phosphor layer 18a, the lower half of the LED lamp 10 is combined with the upper half thereof. Alternatively, the phosphor layer 18a may be made by printing or coating the phosphor 18 on the transparent resin to have a predetermined thickness. Further, the phosphor layer 18a may be made by coating the resin with phosphor mixed on the transparent resin without forming the ring-shaped groove. The ratio of excitation light and direct light (blue light) varies according to a change in the thickness of the phosphor layer 18a or the concentration of phosphor 18. Thus, the color of light radiated from the emission observation surface can be changed by controlling the ratio.

The blue LED 25 is fixed through the mount 23 such as epoxy resin containing a light dispersion agent on the lead electrode 20. The lead electrode 20 is connected through the bonding wire 27 with a p-electrode (not shown) and the lead electrode 21 is connected through the bonding wire 28 with an n-electrode (not shown). The blue LED 25 is sealed and fixed with the transparent resin 30.

The transparent resin 30 is of silicone resin or epoxy resin which becomes transparent after being cured. Alternatively, low-melting glass may be used as the transparent resin 30 instead of the silicone resin or epoxy resin. The low-melting glass has a good moisture resistance and is capable of blocking ions damaging for the blue led 25 from intruding therein. Furthermore, it transmits the light emitted from the blue LED 25 without absorbing it and, therefore, it is not necessary to increase the light emission based on such estimated absorption.

The phosphor 18 absorbs part of light emitted from the blue LED 25 and then emits light having a wavelength different from that of absorbed light. It is of YAG phosphor which is activated with cerium.

The details of the mount 23 in the LED lamp 10 will be described below.

The mount 23 may be of various resins such as epoxy resin in consideration of the workability. The mount 23 is preferably of resin that has an adherability and contains inorganic material with a good thermal conductivity.

In general, the mount 23 is of Ag (silver) containing epoxy resin (Ag paste). Ag has a good light reflecting capability and, therefore, is suitable for dispersion of light. However, there is a problem that Ag in epoxy resin or epoxy resin itself degrades to be stained black or brown when the LED lamp 10 with a high intensity is used for many hours. Especially, when the mount 23 near the blue LED 25 is thus stained, the emission efficiency will be highly reduced. The mount 23 is needed to have various properties such as adherability as well as weather resistance against light emitted from the blue LED 25. The degradation of resin described above due to light radiated can be overcome by using inorganic material resistant to the light degradation or weather resistant resin for the mount 23.

The mount 23 may be of silicone resin other then epoxy resin. The inorganic material contained in the mount 23 preferably has a good adhesiveness to the resin and a resistance to light emitted from the blue LED 25. Thus, the inorganic material contained in the resin is to be at least one selected from gold, aluminum, copper, alumina, silica, titanium oxide, boron nitride, tin oxide, zinc oxide, diamond. Especially, gold, aluminum, copper and diamond are suitable for enhancing the heat radiation. Alumina, silica, titanium oxide and boron nitride have a good weather resistance and, therefore, are capable of maintaining a high reflectivity.

The inorganic material may be formed into various shapes such as sphere, needle and flake in consideration of dispersion and electrical conductivity. The amount of inorganic material contained in the resin for the mount 23 can be varied to control the heat radiation or electrical conductivity. However, when the amount of inorganic material contained in the resin increases, the degradation of resin is suppressed but the adhesiveness is lowered. Therefore, it is to be 5 mass % to 80 mass %. When it is 60 mass % to 80 mass %, the degradation of resin is more suitably suppressed.

As described above, the inorganic material contained in the mount 23 is selected from those that are resistant against the degradation caused by light of the blue LED 25 while excluding Ag that is subject to the degradation. Thus, the resin composing the mount 23 can be prevented from degrading. Therefore, the stained site occurred when degraded can be reduced, thereby preventing the emission efficiency from reducing.

Accordingly, the high-intensity LED lamp 10 that a reduction in emission efficiency can be suppressed even when used for many hours can be provided. In addition, the properties of the blue LED 25 can be further stabilized by selecting the inorganic material with a good thermal conductivity, whereby the stained site can be further reduced.

Figure 3:
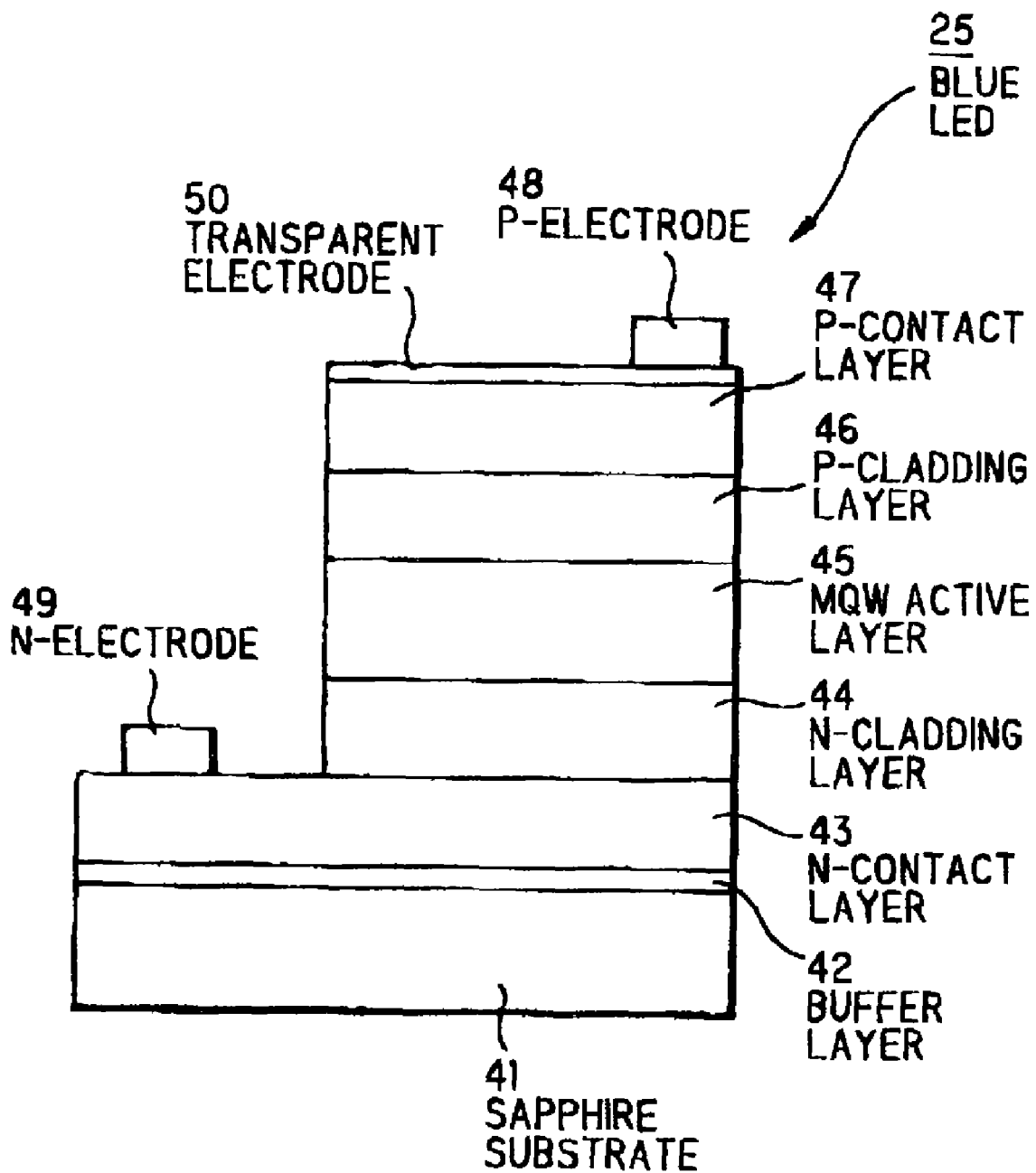
FIG. 3 is a cross sectional view showing the structure of a blue LED used in the light emitting apparatus in FIG. 1.

Next, the structure of the blue LED 25 will be explained below with reference to FIG. 3. As shown in FIG. 3, the blue LED 25 includes a transparent substrate such as a sapphire substrate 41. On the sapphire substrate 41, using MOCVD method etc., nitride semiconductor layers, e.g., a buffer layer 42, an n-contact layer 43, n-cladding layer 44, MQW (multi-quantum well) active layer 45, p-cladding layer 46 and p-contact layer 47 are formed in this order. Furthermore, using sputtering, vacuum deposition etc., a transparent electrode 50 on the entire surface of the p-contact layer 47, a p-electrode 48 on part of the transparent electrode 50 and an n-electrode 49 on part of the n-contact layer 43 are formed.

The buffer layer 42 is of. e.g., AlN and the n-contact layer 43 is of, e.g., GaN.

The n-cladding layer 44 is of, e.g. $Al_yGa_{1-y}N(0 \leq y<1)$, the p-cladding layer 46 is of, e.g., $Al_xGa_{1-x}N(0<x<1)$, and the p-contact layer 47 is of, e.g., $Al_zGa_{1-z}N(0 \leq z<1, z(x))$. The bandgap of the p-cladding layer 46 is made to be greater than that of the n-cladding layer 44. The n-cladding layer 44 and the p-cladding layer 46 may be a single layer or may have a superlattice structure that less than 100 Å thick nitride semiconductor films having different compositions from each other are formed. The thickness of less than 100 Å can prevent cracks or crystal defects from occurring in the film.

The MQW active layer 45 is composed of InGaN well layers and GaN barrier layers. The thickness of the well layers and barrier layers is made to be less than 100 Å, preferably 60 to 70 Å so as to give a superlattice. In crystal properties, InGaN is softer than Al containing nitride semiconductor, e.g., AlGaN. Therefore, when InGaN is used as a component for the active layer 45, the entire nitride semiconductor layers formed thereon become difficult for cracks to occur.

The MQW active layer 45 may be composed of InGaN well layer and AlGaN barrier layers. Also, it may be composed of AlInGaN well layers and AlInGaN barrier layers. In these cases, the bandgap energy of the barrier layer is to be greater than that of well layer.

A reflection layer may be formed between the sapphire substrate 41 and the MQW active layer 45, e.g., between the buffer layer 42 and the n-contact layer 43. Alternatively, the reflection layer may be formed on the other surface of sapphire substrate 41 opposite to the surface of sapphire 41 on which the nitride semiconductor layers are formed. The reflection layer desirably has a maximum reflectivity to light emitted from the active layer 45, and it may be of, e.g., aluminum or GaN group multiple layers. When the reflection layer is formed, light emitted from the active layer 45 can be reflected on the reflection layer. Therefore, the internal absorption of light emitted therefrom can be reduced and light outputted upward can be increased. Also, light radiated into the mount 23 can be reduced and the mount 23 can be prevented from degrading.

The emission wavelength of the blue LED 25 is 380 nm to 480 nm. The peak emission wavelength of the blue LED 25 is about 450 nm.

In operation, when a predetermined voltage is applied between lead electrodes 20, 21 of the LED lamp 10, the blue LED 25 emits blue light with a wavelength of 450 nm. The blue light is reflected on the first reflector 12, passed through the light passing hole 35 provided in the circular plate 14 and the second reflector 16 as shown by dotted lines 32, 33 with arrows in FIG. 1, entered into the phosphor layer 18a, exciting the phosphor 18. The phosphor 18 excited emits yellow light of 560 nm to 570 nm. In this case, part of the blue light emitted passes through the phosphor layer 18a and transparent resin 30 without being wavelength-converted while being not radiated to the phosphor layer 18a or being reflected on the phosphor 18. On the way of the passing, the light is mixed with the excitation light. The mixed light passes through the transparent resin 30, then being outputted from the LED lamp 10. The mixed light is felt white by human eyes, i.e., men sense that the LED lamp 10 emits white light.

The blue light reflected on the reflective surface of the first reflector 12 has a higher optical density as the reflective surface becomes closer to the blue LED 25. Thus, thicker reflected light as shown by the dotted line 32 in FIG. 1 is radiated to the outside of the ring-shaped phosphor layer 18a, and thinner reflected light as shown by the dotted line 33 in FIG. 1 is radiated to the inside of the phosphor layer 18a. In the ring-shaped phosphor layer 18a, the thinner light converges on the narrow-area inside and the thicker light converges on the wide-area outside. Therefore, the entire ring of the phosphor layer 18a has a uniform optical density. Since the optical density is thus uniform, the light is radiated uniformly to the entire phosphor 18 in the phosphor layer 18a and, therefore, the wavelength conversion is stably and efficiently performed.

On the other hand, light reflected or dispersed on the lower surface of the phosphor layer 18a is reflected on the second reflector 16 and part of the reflected light is radiated to the phosphor 18 again. However, the area of the ring-shaped phosphor layer 18a is smaller than the entire horizontal light passing area where the phosphor layer 18a is included and, therefore, the amount of re-radiation is small. Namely, most of the light reflected on the second reflector 16 is outputted through the transparent resin 30 around the phosphor layer 18a without entering the phosphor layer 18a.

In comparison with the conventional light emitting apparatus that the phosphor is placed at a predetermined density almost around the blue LED, the light emitting apparatus of this embodiment can reduce the amount of light dispersion by the phosphor and, therefore, the emission efficiency thereof can be enhanced that much.

The LED lamp 10 has such a structure that blue light converged by the first reflector 12 is radiated to the phosphor layer 18a, and the phosphor layer 18a only has to be placed at a specific position instead of being placed in the entire transparent resin 30. Therefore, in this embodiment, the amount of phosphor 18 used can be reduced and the manufacturing cost thereof can be lowered that much.

[Second Embodiment]

Figure 4:
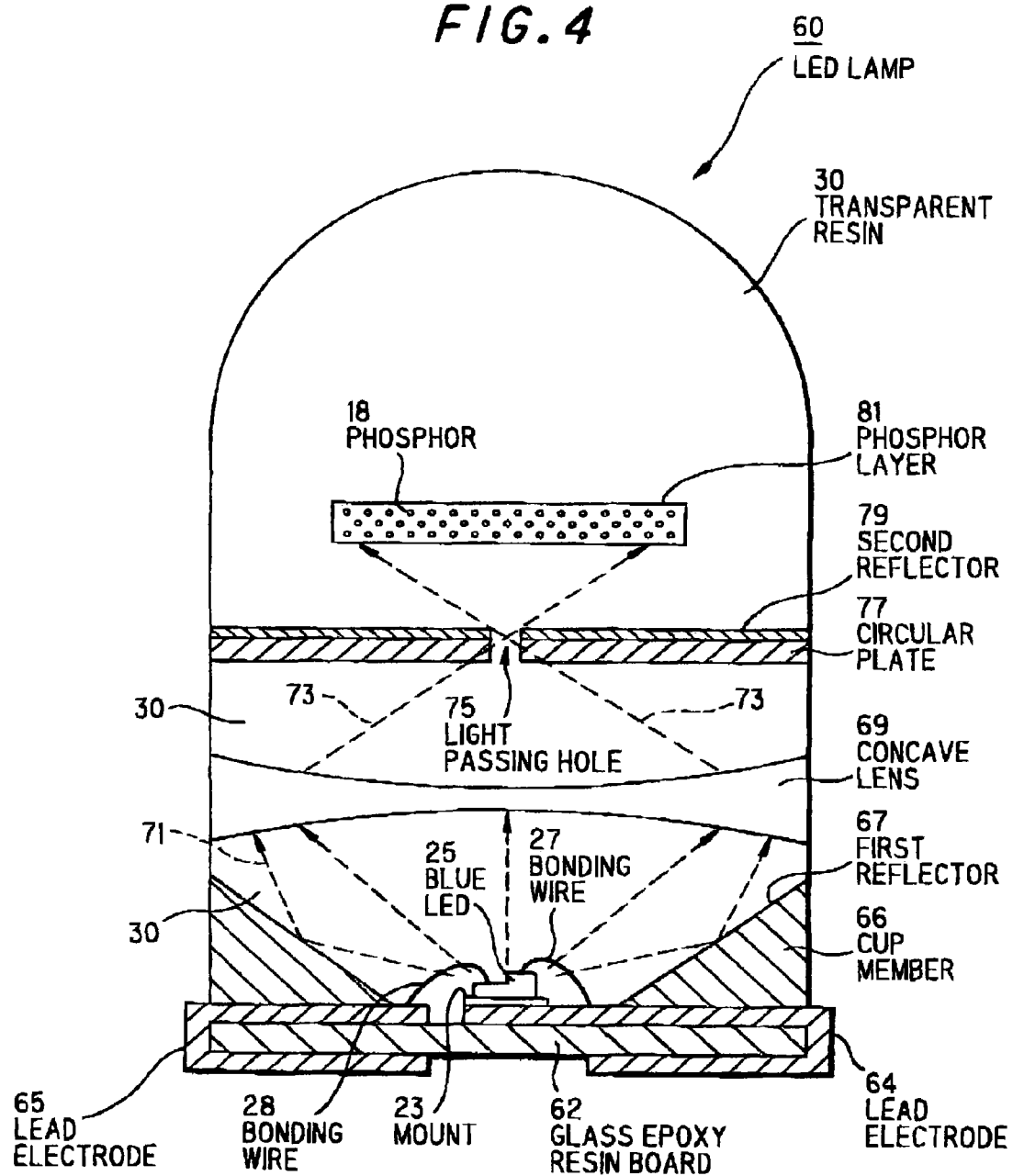
FIG. 4 is a cross sectional view showing the structure of a light emitting apparatus in a second preferred embodiment according to the invention.

FIG. 4 is a cross sectional view showing the structure of a light emitting apparatus in the second preferred embodiment according to the invention. In FIG. 4 the same numerals are used for the same components in FIG. 1 and the explanation thereof is omitted here.

An LED lamp 60 shown in FIG. 4 is of so-called lens type. On and under an isolative glass epoxy resin board 62, there are provided two lead electrodes 64, 65 that are insulated from each other and are of gold wiring pattern. On the lead electrodes 64, 65, there are provided a first reflector 67 that is of plastic and is cup-shaped.

The first reflector 67 has such a reflection mirror that blue light emitted from the blue LED 25 is reflected on the surface as shown by dotted lines 71 with arrows. The lead electrodes 64, 65 are asymmetrical to each other, one lead electrode 64 is extended to the center of the bottom of a cup formed by the first reflector 67 and the other lead electrode 65 is a little exposed at the edge of the bottom of the cup.

Over the first reflector 67, there is provided a concave lens 69 (convergence lens) such that blue light reflected on the first reflector 67 is converged at a specific position as shown by dotted lines 73 with arrows in FIG. 4. Over the concave lens 69, there are provided a circular plate 77 and a second reflector 79 that have a light passing hole 75 at the converging position of blue light. Over these, there is provided a circular plate phosphor layer 81. The components above the first reflector are sealed with the lens-type transparent resin 30.

The first reflector 67 is of reflection film formed on a cup member 66 by using aluminum deposition etc. The second reflector 79 is of reflection film formed in like manner or of aluminum plate attached to the circular plate 77. The first and second reflectors 67, 79 are preferably of reflection film is such that light with a wavelength of 350 to 780 nm is reflected on.

Blue light that passes through the light passing hole 75 provided in the circular plate 77 and the second reflector 79 is radiated to the phosphor layer 81. Part of the passed blue light is passed through the transparent resin 30 without being wavelength-converted while being not radiated to the phosphor layer 81 or being reflected on the phosphor 18 in the phosphor layer 81. The light passing hole 75 is filled with the transparent resin 30. The phosphor layer 81 is placed over the light passing hole 75 provided at the convergence position of the concave lens 69 and is placed at a position where a predetermined amount of blue light is radiated to.

The phosphor layer 81 is made by forming a groove with a predetermined diameter at a predetermined position in a circular plane of bombshell-shaped epoxy resin or silicone resin corresponding to the upper half of the LED lamp 60, then pouring resin with the phosphor 18 mixed into the groove. After making the phosphor layer 81, the lower half of the LED lamp 60 is combined with the upper half thereof. Alternatively, the phosphor layer 81 may be made by printing or coating the phosphor 18 on the transparent resin to have a predetermined thickness. By varying the thickness of the phosphor layer 81 or the concentration of phosphor 18, the color of excitation light can be changed.

In operation, when a predetermined voltage is applied between the lead electrodes 64, 65 of the LED lamp 60, the blue LED 25 emits blue light with a wavelength of 450 nm. The blue light is reflected on the first reflector 67 as shown by the dotted lines 71 in FIG. 4, converged by the concave lens 69 as shown by dotted lines 73 with arrows in FIG. 4, passed through the light passing hole 75 provided in the circular plate 77 and the second reflector 79 as shown by the dotted lines 73, entered into the phosphor layer 81, exciting the phosphor 18. The phosphor 18 excited emits yellow light of 560 nm to 570 nm. In this case, part of the blue light emitted passes through the phosphor layer 81 and transparent resin 30 without being wavelength-converted while being not radiated to the phosphor 18 or being reflected on the phosphor 18. On the way of the passing, the light is mixed with the excitation light. The mixed light passes through the transparent resin 30, then being outputted from the LED lamp 60. The mixed light is felt white by human eyes, i.e., men sense that the LED lamp 60 emits white light.

On the other hand, light reflected or dispersed on the lower surface of the phosphor layer 81 is reflected on the second reflector 79 and part of the reflected light is radiated to the phosphor 18 again. However, the area of the phosphor layer 81 is smaller than the entire horizontal light passing area where the phosphor layer 81 is included and, therefore, the amount of re-radiation is small. Namely, most of the light reflected on the second reflector 79 is outputted through the transparent resin 30 around the phosphor layer 81 without entering the phosphor layer 81.

In comparison with the conventional light emitting apparatus that the phosphor is placed at a predetermined density almost around the blue LED, the light emitting apparatus of this embodiment can reduce the amount of light dispersion by the is phosphor and, therefore, the emission efficiency thereof can be enhanced that much.

The LED lamp 60 has such a structure that blue light reflected on the first reflector 67 and then converged by the concave lens 69 is radiated to the phosphor layer 81, and the phosphor layer 91 only has to be placed at a specific position instead of being placed in the entire transparent resin 30. Therefore, in this embodiment, the amount of phosphor 18 used can be reduced and the manufacturing cost thereof can be lowered that much.

The blue LED 25 emits light isotropically and, therefore, the density of light radiated to the mount 23 is high. When the phosphor 18 is included in the mount 23, the light emitted from the blue LED 25 is reflected on the phosphor 18 in the mount 23. Thereby, excitation light from the phosphor 18 in the mount 23 is additionally radiated isotropically. Thus, if the phosphor 18 is included in the mount 23, the LED lamp has higher intensity.

[Third Embodiment]

Figure 5:
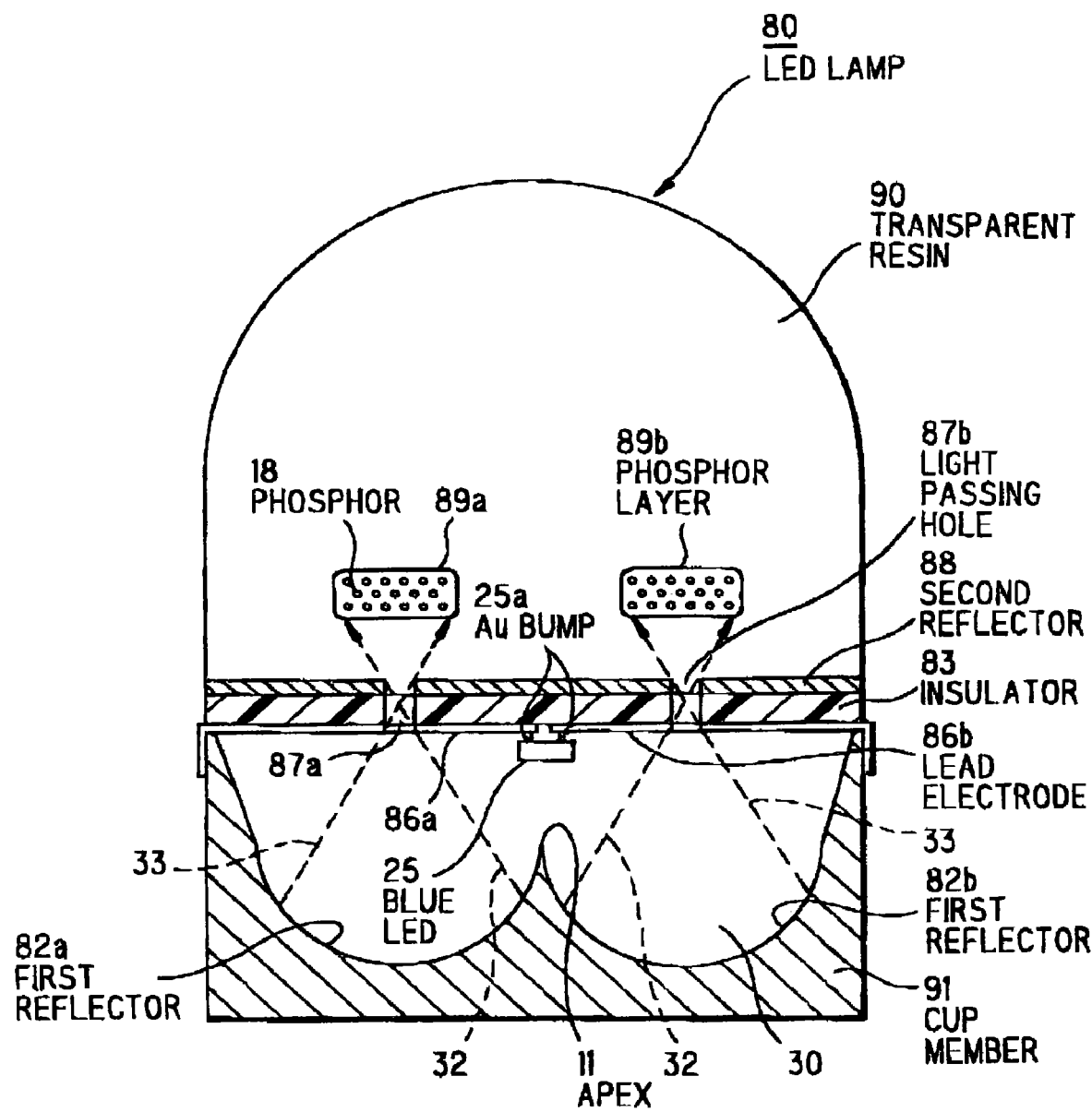
FIG. 5 is a cross sectional view showing the structure of a light emitting apparatus in a third preferred embodiment according to the invention.
Figure 6:
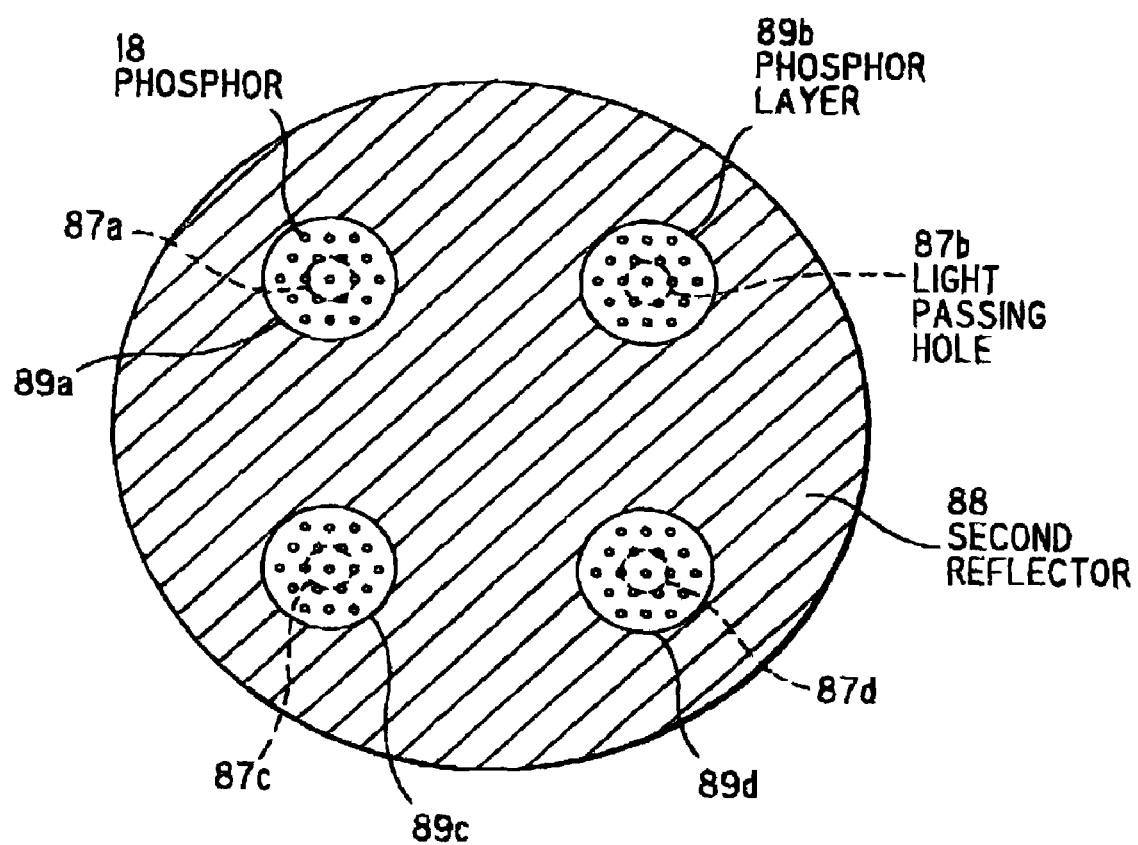
FIG. 6 is a perspective top view showing the light emitting apparatus in FIG. 5.

FIG. 5 is a cross sectional view showing the structure of a light emitting apparatus in the third preferred embodiment according to the invention. FIG. 6 is a perspective top view showing the light emitting apparatus in FIG. 5.

In this embodiment, an LED lamp 80 includes: one blue LED 25; four first reflectors 82a, 82b, 82c and 82d that are provided on a cup member 91 of resin or metal; a circular plate insulator 83 of resin etc.; and four phosphor layers 89a, 89b, 89c and 89d that are placed corresponding to the first reflectors 82a to 82d. The phosphor layers 89a to 89d, the phosphor 18 and the other components where light passes through or is reflected are of the same property, material and composition as those in the above embodiments.

On the cup member 91, there are provided the four concave first reflectors 82a, 82b, 82c and 82d the concave portions on which are filled with the transparent resin 30. At the center of the first reflectors 82a, 82b, 82c and 82d, there is formed an apex 11. Around the apex 11, the first reflectors 82a, 82b. 82c and 82d are each placed/divided by 90° on the same circumference. Over the apex 11, the blue LED 25 is provided.

Under the insulator 83, there are provided lead electrodes 86a, 86b as shown in FIG. 5. The blue LED 25 is flip-chip connected through an Au bump 25a with the lead electrodes 86a, 86b. On the insulator 83, there is attached a second circular plate reflector 88 with the same diameter as the insulator 83. The second reflector 88 has a reflection surface thereon made by plating or deposition.

In the insulator 83 and the second reflector 88, there are provided spot-like light passing holes 87a, 87b, 87c and 87d to pass upward light reflected on the first reflectors 82a, 82b, 82c and 82d. Over the light passing holes 87a, 87b, 87c and 87d, there are placed the circular phosphor layers 89a, 89b, 89c and 89d, respectively, with the phosphor 18 mixed. The phosphor layers 89a to 89d are made to have a diameter smaller than that of the second reflector 88. The phosphor layers 89a to 89d are sealed inside the transparent resin 90 that is formed into bombshell. The transparent resin 90 is, for example, configured by sealing the second reflector 88 up to the level where the phosphor layers 89a to 89d are located, then making four concave portions corresponding to the diameter of the phosphor layers 89a to 89d, forming the phosphor layers 89a to 89d in the concave portions, and molding additionally the resin thereon.

The ends of the lead electrodes 86a, 86b are folded on the side of the cup member 91 while being exposed outside the transparent resin 90. The exposed portions are bonded to external wiring (not shown) to connect electrically with the blue LED 25 sealed with the transparent resin 90.

Figure 7A:
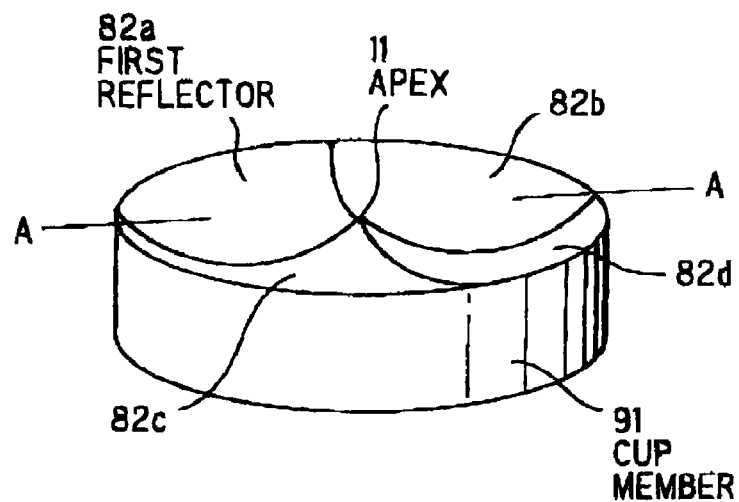
FIG. 7A is a perspective view showing first reflectors 82a to 82d in FIG. 5.
Figure 7B:
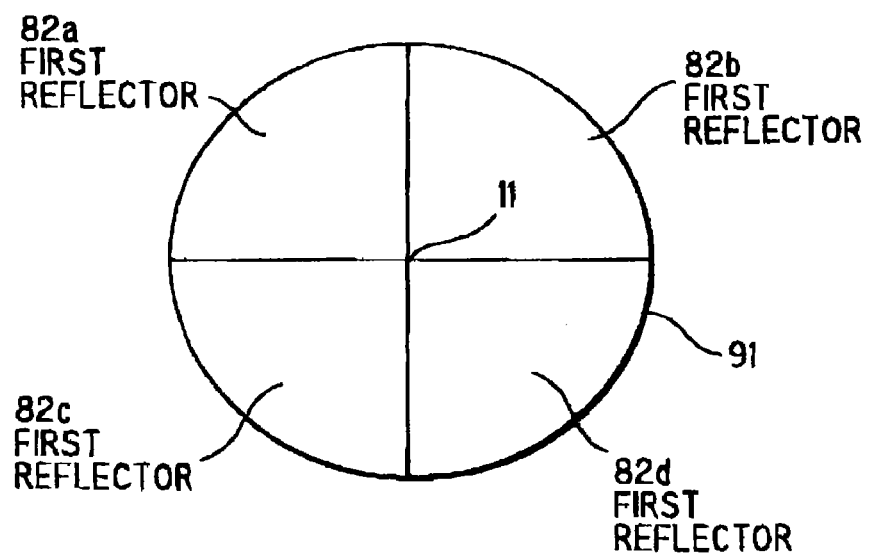
FIG. 7B is a top view showing the first reflectors 82a to 82d in FIG. 5.
Figure 7C:
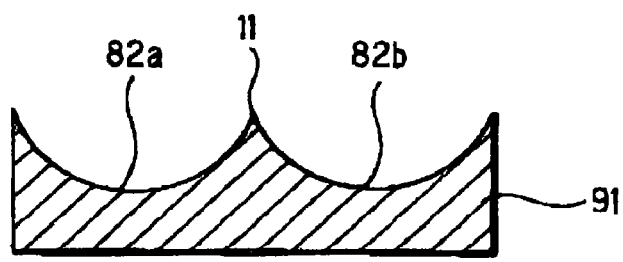
FIG. 7C is a cross sectional view cut along the line A—A in FIG. 7A.

FIGS. 7A to 7C show the details of the first reflectors 82a to 82d FIG. 7A is a perspective view, FIG. 7B is a top view of FIG. 7A and FIG. 7C is a cross sectional view cut along the line A—A in FIG. 7A. The first reflectors 82a to 82d ach have a section obtained by dividing equally a circle in four and each divided section is formed into concave to have a predetermined diameter. In other words, the concaves of the first reflectors 82a to 92d are formed to have such a curvature that most of the light emitted from the blue LED 25 and then reflected on the first reflectors 82a to 82d is radiated to the lower surface of the phosphor layers 89a to 89d. The concaves may be formed by resin molding, cutting, pressing etc.

In operation, when a predetermined voltage is applied, the blue LED 25 emits light from the bottom. The blue light emitted is reflected on the first reflectors 82a to 82d, converged by the first reflectors 82a to 82d as shown by the dotted lines 32, 33 with arrows in FIG. 5, passed through the light passing holes 87a to 87d, entered into the lower surface of the phosphor layers 89a to 89d. Part of the light entered into the phosphor layers 89a to 89d is, as described in the first embodiment, absorbed by the phosphor 18 mixed in the phosphor layers. The phosphor 18 emits light having a wavelength different from that of absorbed light. This light is mixed with blue light being not radiated to the phosphor layer or being reflected on the phosphor 18. The mixed light is outputted from the emission observation surface as light to be sensed (e.g., white) other than blue.

The light reflected on the phosphor layers 89a to 89d and directed to the second reflector 88 is reflected on the second reflector 88 and then outputted in the direction of the emission observation surface. Therefore, the emission efficiency can be enhanced that much. In addition, since the phosphor layers 89a to 89d has an area smaller than that of phosphor layer 1a in the first embodiment, the amount of light dispersion caused by the phosphor 18 can be reduced and, therefore, the emission efficiency can be enhanced that much. Furthermore, the amount of expensive phosphor 18 can be reduced and, therefore, the manufacturing cost can be lowered that much.

[Fourth Embodiment]

Figure 8:
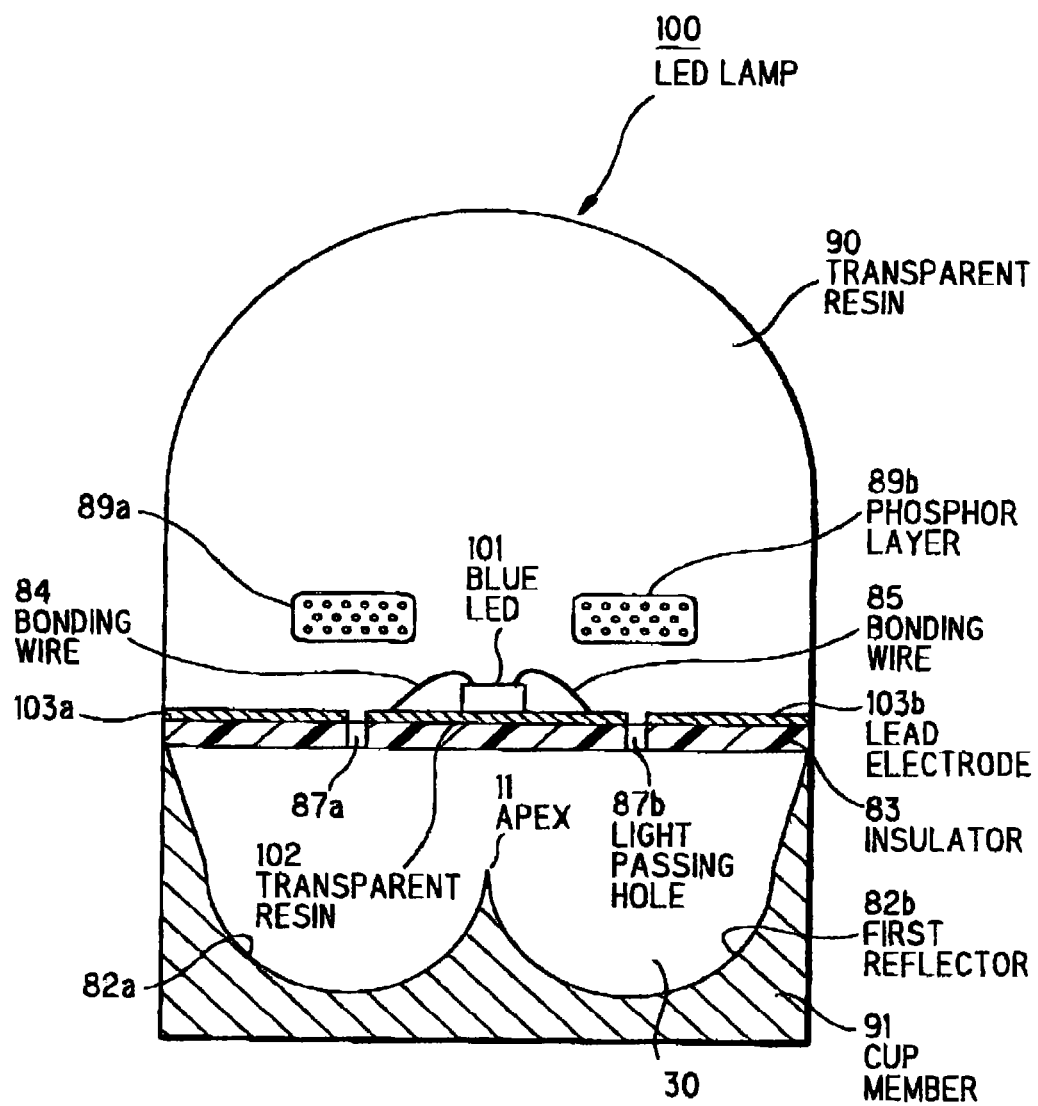
FIG. 8 is a cross sectional view showing the structure of a light emitting apparatus in a fourth preferred embodiment according to the invention.
Figure 9:
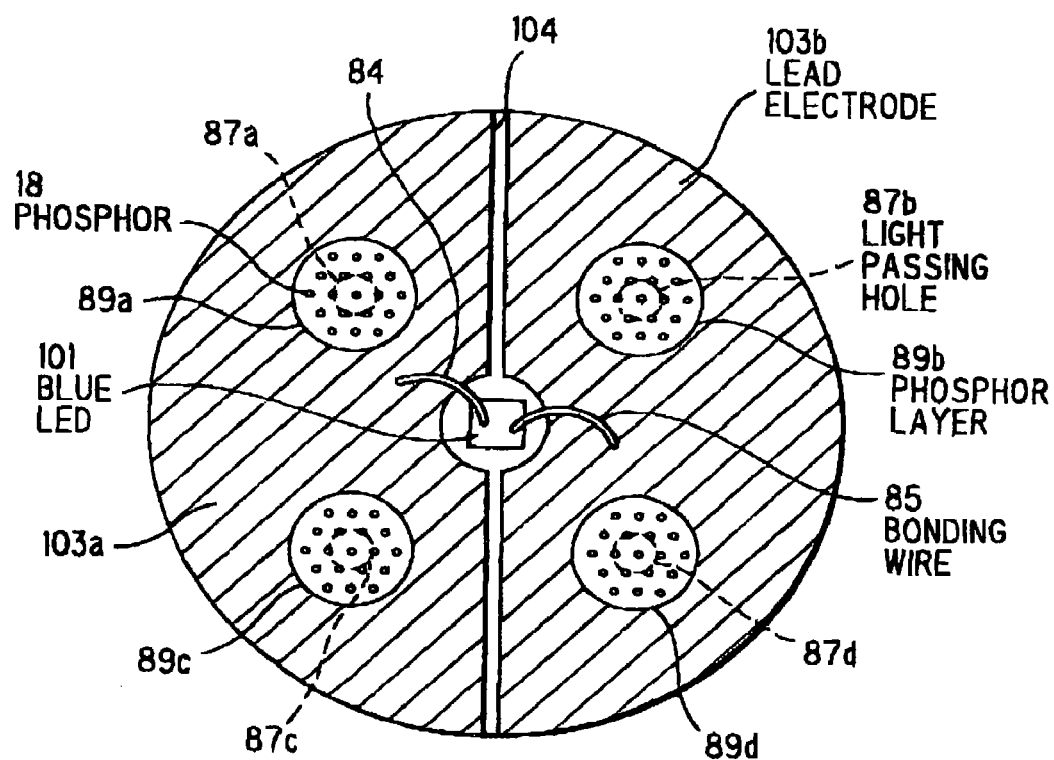
FIG. 9 is a perspective top view showing the light emitting apparatus in FIG. 8.

FIG. 8 is a cross sectional view showing the structure of a light emitting apparatus in the fourth preferred embodiment according to the invention. FIG. 9 is a perspective top view showing the light emitting apparatus in FIG. 8. In FIGS. 8 and 9 the same numerals are used for the same components in FIGS. 5 and 6 and the explanation thereof is omitted here.

The difference of this embodiment from the third embodiment is that on the insulator 83 there is provided a blue LED 101 which emits light from the bottom (or which has such a structure that the amount of emission from the bottom is greater than that from the top) and boding wires 84, 85 are connected with the LED 101 above the insulator 83. In this case, the insulator 83 is needed to be transparent. The blue LED 101 is mounted on the insulator 83 through transparent resin (adhesive) 102.

Since the blue LED 101 is mounted on the insulator 83, the lead electrodes 86a, 86b provided under the insulator 83 as shown in FIG. 5 can be removed. Furthermore, the second reflector 88 is replaced by two semicircle lead electrodes 103a, 103b. There is provided a gap 104 between the two semicircle lead electrodes 103a, 103b not to contact each other. The lead electrode 103a is connected through the bonding wire 84 with one electrode of the blue LED 101, and the lead electrode 103b is connected through the bonding wire 85 with the other electrode of the blue LED 101.

There are provided reflection surfaces made by plating, deposition etc. on the lead electrodes 103a, 103b. The reflection surfaces functions like the second reflector 88 in the third embodiment. Thus, in the fourth embodiment, the number of components can be less than that in the third embodiment. In addition, since the blue LED 101 is mounted on the insulator 83, the boding is easy to conduct. The other effects and functions in this embodiment are the same as the third embodiment.

In the third and fourth embodiments, the ratio of excitation light and direct light (blue light) varies according to a change in the thickness of the phosphor layers 89a to 89d or the concentration of phosphor 18, like the first and second embodiments. Thus, the color of light radiated from the emission observation surface can be changed by controlling the ratio.

Although in FIGS. 5 and 8 the phosphor layers 89a to 89d are placed on the same plane, they may be placed at levels different from one another. In this case, the curvature of the first reflectors 82a to 82d is to be adjusted according to each convergence position.

Although in FIGS. 5 and 8 the phosphor layers 99a to 89d have the same diameter and form, they may have different diameter and forms from one another. Further, they may have different thicknesses. In this case, the inner diameter of the light passing holes 87a to 87d is desirably to be adjusted according to the diameter or form of the phosphor layers 89a to 89d.

There may be used a light emitting apparatus that the third and fourth embodiments are combined. Namely, the light emitting apparatus is constructed such that the lead electrodes 103a, 103b and the blue LED 25 are placed under the insulator 83 and the second reflector 88 is placed on the insulator 83. In this construction, light from the blue LED 25 is radiated to the first reflectors 82a to 82d without passing through the transparent insulator and, therefore, the usability of light can be improved.

The phosphor 18 used for the light emitting apparatuses (LED lamps 10, 60, 80 and 100) in the first to fourth embodiments may be any of red, green and blue phosphors that are now commercially available. For example, the compounds for the phosphors are as follows:

Red phosphor; $La_2O_2S:Eu$, $Sm(YOS:Eu)$
Green phosphor; $3(Ba, Mg, Eu, Mu)O\ SAl_2O_3(BAM:Eu, Mn)$
Blue phosphor; $(Sr, Ca, Ba, Eu)_{10}(PO_4)_6Cl_2$ Furthermore, the mount 23 may include the phosphor 18. The LED lamp using the mount 23 with the phosphor 18 included has an optical density significantly higher than the LED lamp without the phosphor 18. Namely, the light emitted from the blue LED 25 does not pass through the phosphor 18 and, therefore, the emitted light is reflected on the phosphor 18 provided near the blue LED 25, radiated additionally as excitation light isotropically from the phosphor 18. The radiated light will be reflected on the first reflector 12, 67 or 82a to 82d, and reflected based on the difference between the refractive indexes of components of the LED lamp. Thus, the light is thickly confined locally near the blue LED 25 and the optical density near the blue lED 25 becomes significiently high. In such a LED lamp, since part of light emitted from the blue LED 25 is previously wavelength-converted by the phosphor layer 18 in the concentration of phosphor 18 in the phoasphor layer 18a, the concentration of phosphor 18 in the phosphor layer 18a can be lowered. Therefore, the light dispersion and shielding effects due to the phosphor 18 in the phosphor layer 18a can br reduced and, as a result, the light intensity of LED lamp can be enhanced that much.

[Advantages of the Invention]

In the light emitting apparatus of the invention, light dispersed in the direction opposite to the emission observation surface is reflected on the reflection mirror in the direction of the emission observation surface. Therefore, the light extraction efficiency (emission efficiency) can be enhanced. Also, the light emitted from LED is converged and the phosphor is placed on the convergence region. Therefore, the amount of phosphor used can be reduced. Furthermore, part of light reflected on the reflection mirror is extracted in the direction of the emission observation surface while passing through the phosphor. Therefore, the light extraction efficiency (emission efficiency) can be enhanced.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting apparatus, comprising:
    a light emitting element comprising a nitride semiconductor;
    a phosphor that absorbs light emitted from said light emitting element and emits light with a wavelength different from that of the absorbed light;
    a first reflection mirror that reflects the light emitted from said light emitting element to converge the light;
    a second reflection mirror that has a light passing hole at a position on which the light reflected on said first reflection mirror is converged and that has a reflection surface on the side opposite to the side facing said first reflection mirror; and
    a phosphor layer that includes said phosphor, said phosphor layer being placed over said light passing hole and at a region in a transparent resin in which part of light passing through said light passing hole is radiated, and
    wherein said second reflection mirror is disposed to allow light radiated from said phosphor layer to be reflected toward an emission observation surface.

2. The light emitting apparatus according to claim 1, wherein:
    said first reflection mirror comprising a ring-shaped concave portion to converge the light, and said light passing hole comprises a shape such that the light reflected on the ring-shaped concave is converged while having a ring shape.

3. The light emitting apparatus according to claim 1, wherein:

said phosphor layer has a thickness in the light emission direction which is adjustable according to the color of light to be extracted from said light emitting apparatus.

4. The light emitting apparatus according to claim 1, wherein:

said phosphor layer includes said phosphor the concentration of which is adjustable according to the color of light to be extracted from said light emitting apparatus.

5. A light emitting apparatus, comprising:

a first reflector comprising a concave shape for converging light emitted from a light emitting element to a predetermined position, said light emitting element mounted on a first surface of a plate facing said first reflector;

a second reflector provided on a second surface of said plate opposite the first surface;

a light passing hole in said plate located at the predetermined position for permitting the converged light to pass through said plate; and a phosphor layer displaced from the second surface of said plate and aligned over said light passing hole, and said phosphor layer comprising a phosphor that absorbs light and emits light having a wavelength different from that of the absorbed light, wherein the converged light passing through said light passing hole is incident upon said phosphor layer and at least a portion of the converged light is absorbed by said phosphor, and said second reflector is disposed to allow light radiated from said phosphor layer to be reflected toward an emission observation surface.

6. The light emitting apparatus according to claim 5, wherein said first reflector comprises a reflection film that reflects light with a wavelength in a range from about 350 nm to 780 nm.

7. The light emitting apparatus according to claim 5, wherein:

said first reflector comprises a ring-shaped concave portion for converging light emitted from said light emitting element into a ring-shape onto the predetermined position; and said light passing hole comprises a ring-shape substantially corresponding to the ring-shape of the converged light.

8. The light emitting apparatus according to claim 5, wherein said phosphor layer comprises a ring shape axially aligned with said light passing hole.

9. The light emitting apparatus according to claim 5, further comprising:

a transparent resin that seals substantially the entire light emitting apparatus.

10. The light emitting apparatus according to claim 9, wherein said transparent resin comprises a low-melting glass.

11. The light emitting apparatus according to claim 5, further comprising:

a mount upon which said light emitting element is mounted, wherein said mount comprises a resin.

12. The light emitting apparatus according to claim 11, wherein the resin of said mount comprises the phosphor that absorbs light emitted from said light emitting element and emits light having a wavelength different from that of the absorbed light.

13. The light emitting apparatus according to claim 11, wherein the resin of said mount comprises at least one inorganic material selected from the group of alumina, silica, titanium oxide, and boron nitride.

14. The light emitting apparatus according to claim 13, wherein the at least one inorganic material is formed into a shape of one of a sphere, a needle, and a flake.

15. The light emitting apparatus according to claim 5, wherein the phosphor comprises a yttrium aluminum garnet (YAG) phosphor activated with cerium.

16. The light emitting apparatus according to claim 5, wherein said light emitting element comprises a nitride semiconductor.

* * * * *